United States Patent
Kikuchi et al.

(12) 
(10) Patent No.: US 6,385,214 B1
(45) Date of Patent: May 7, 2002

(54) SIGNAL MULTIPLEXING CIRCUIT

(75) Inventors: Hidekazu Kikuchi; Norihito Suzuki, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/231,631

(22) Filed: Jan. 15, 1999

(30) Foreign Application Priority Data

Jan. 16, 1998 (JP) ............................................. 10-007001

(51) Int. Cl.[7] .......................... H04K 17/62; H04K 11/26
(52) U.S. Cl. ...................................... 370/537; 327/407
(58) Field of Search .................................. 370/532, 533, 370/535, 536, 537, 538, 539, 540; 327/407, 408, 409, 410, 411, 412, 413

(56) References Cited

U.S. PATENT DOCUMENTS 4,669,096 A * 5/1987 Heimbuch .................. 327/407
5,955,912 A * 9/1999 Ko ............................. 327/410
6,104,338 A * 8/2000 Lakshmikumar ............ 327/407
6,310,509 B1 * 10/2001 Davenport et al. ......... 327/407

* cited by examiner

*Primary Examiner*—Ajit Patel
(74) *Attorney, Agent, or Firm*—Ronald P. Kananen, Esq.; Rader, Fishman & Grauer, PLLC

(57) ABSTRACT

A signal multiplexing circuit capable of reducing jitter provided with a first circuit for outputting input differential data by receiving a select drive signal comprising first and second NMOS transistors whose sources are commonly connected, a second circuit for outputting the input differential data with an inverted phase with respect to the output of the first circuit so as to add it to the output of the first circuit and never being selected by a select drive signal comprising third and fourth transistors whose sources are commonly connected, and a signal extracting circuit configured by connecting a connecting point of the sources of the first and second transistors to an output line of a select drive signal of a selector. As a result, jitter of the output signal can be reduced.

16 Claims, 7 Drawing Sheets

SIGNAL MULTIPLEXING CIRCUIT

BACKGROUND OF THE INVENTION

1. Field of the Invention

The present invention relates to a signal multiplexing circuit which successively selects and sends out one by one ensured multi-phase differential data from among multi-phase differential data which become ensured for a certain period after changing in different phases.

2. Description of the Related Art

FIG. 6 is a circuit diagram of an example of the configuration of a signal multiplexing circuit of the related art.

This signal multiplexing circuit 10 comprises signal extracting circuits 11-1, 11-2, 11-3, . . . 11-n constituted by differential amplifiers, a selector 12, an output circuit 13, and a pair of signal lines Q and QB (B indicates inversion) taking the wired-OR of the outputs of the signal extracting circuits 11-1 to 11-n and inputting the same to the output circuit 13.

The signal extracting circuit 11-1 comprises n-channel MOS (NMOS) transistors NT11 and NT12 whose sources are connected to each other.

A connection point of the sources of the NMOS transistors NT11 and NT12 is connected to an output 12-1 of the selector 12.

A gate electrode of the NMOS transistor NT11 is connected to an input line of the differential data signal IN1 and a drain thereof is connected to the signal line QB. A gate electrode of the NMOS transistor NT12 is connected to an input line of the differential data signal IN1B and a drain thereof is connected to the signal line Q.

Below, in the same way, the signal extracting circuit 11-n comprises NMOS transistors NTn1 and NTn2 whose sources are connected to each other.

A connection point of the sources of the NMOS transistors NTn1 and NTn2 is connected to an output 12-n of the selector 12.

A gate electrode of the NMOS transistor NTn1 is connected to an input line of the differential data signal INn and a drain thereof is connected to the signal line QB. A gate electrode of the NMOS transistor NTn2 is connected to an input line of the differential data signal INnB and a drain thereof is connected to the signal line Q.

The selector 12 has n number of select lines 12-1 to 12-n which are respectively connected to the connecting points of sources of the NMOS transistors of the signal extracting circuits 11-1 to 11-n. It selectively drives (passes a current to) the respective select lines 12-1 to 12-n and makes the signal extracting circuits 11-1 to 11-n operate as differential amplifiers.

The output circuit 13 comprises npn-type transistors T131 and T132 and resistors R131 and R132.

An emitter of the transistor T131 is connected to the signal line Q, and an emitter of the transistor T132 is connected to the signal line QB.

A signal OUT is output from a collector of the transistor T131, and a signal OUTB is output from the collector of the transistor T132.

In the above configuration, when multiplexing n-phase data, multi-phase differential data signals IN1, IN1B to INn, INnB are input to the respective signal extracting circuits 11-1 to 11-n.

Here, the differential data signals are supplied to the gate electrodes of the NMOS transistors NT11, NT12, . . . NTn1, NTn2 constituting the differential amplifiers of the respective signal extracting circuits 11-1 to 11-n.

Note that the timing is adjusted so as to change a value of an input potential when the signal extracting circuits 11-1 to 11-n are not selected by the selector 12 and not to change the value when selected.

The signal extracting circuits 11-1 to 11-n are selected successively one by one by the selector 12. As a result, signals are output from the signal extracting circuit in which the input is ensured to the signal lines Q and QB.

The signals output to the signal lines Q and QB are input to the output circuit 13 where multiplexed output signals OUT and OUTB are obtained.

The problem to be solved by the invention is as follows:

In the above-mentioned signal multiplexing circuit of the related art, the input potential of the differential amplifier of the signal extracting circuit inverts when the value of the differential data signal changes. The inversion of the potential causes a noise signal in an output to the output circuit 13 via the parasitic capacitances of the NMOS transistors (for example, NT11 and NT12) constituting the signal extracting circuit.

This noise signal is generated when the signal extracting circuit is not selected by the selector. This ordinarily happens when another extracting circuit is selected and is outputting a signal.

Therefore, the noise signal disturbs the output of other data and causes an increase of jitter of the output.

Here, the relationship of the noise output and the jitter will be explained with reference to FIG. 7.

An output potential of the output circuit 13 (solid line shown in FIG. 7) changes due to an output from a signal extracting circuit (differential amplifier) selected by a selector 12.

If noise is generated by another output which is not selected at the same time, the actual output potential from the output circuit 13 becomes as shown by the dotted line shown in FIG. 7. The timing of change of the output becomes earlier by exactly td which causes jitter in the output.

It is necessary to reduce the jitter to operate a multiplexing circuit at a high speed.

SUMMARY OF THE INVENTION

An object of the present invention is to provide a signal multiplexing circuit capable of reducing jitter.

To achieve the above object, according to a first aspect of the present invention, there is provided a signal multiplexing circuit which ensures multi-phase differential data changing in different phases to multiplex the same, comprising a plurality of signal extracting circuits, each receiving as input different differential data, including a first circuit for outputting the input differential data when receiving a select drive signal and a second circuit for outputting the input differential data with an inverted phase with respect to the first circuit so as to add it to the output of the first circuit and never being selected by the select drive signal; a driving source for selectively outputting the select drive signal to the first circuits of the signal extracting circuits; and an output circuit for multiplexing outputs of the signal extracting circuits and outputting the same.

According to a second aspect of the invention, there is provided a signal multiplexing circuit which ensures multi-phase differential data changing in different phases to multiplex the same, comprising a plurality of signal extracting circuits, each receiving as input different differential data, including a first circuit for outputting the input differential data when receiving a select drive signal and a second circuit for outputting the input differential data with an inverted phase with respect to the first circuit so as to add it to the output of the first circuit and never being selected by the select drive signal; a selector for selectively outputting the select drive signal to the first circuits of the signal extracting circuits; and an output circuit for multiplexing outputs of the signal extracting circuits and outputting the same.

In the first and second aspects of the invention, preferably the output circuit comprises a pair of first and second signal lines connected in a wired-OR manner to outputs of the first and second circuits of the signal extracting circuits and an output amplifier for outputting the signals which are output to the first and second signal lines.

More preferably, the first circuit comprises first and second transistors with first terminals which are commonly connected; the second circuit comprises third and fourth transistors with first terminals which are commonly connected; one data of the differential data is input to second terminals of the first and fourth transistors, another data of the differential data is input to the second terminals of the second and third transistors, third terminals of the first and third transistors are connected to the first signal line, third terminals of the second and fourth transistors are connected to the second signal line, and first terminals of the first and second transistors are connected to an output of the driving source.

Still more preferably, the first, second, third, and fourth transistors comprise gate insulation type field effect transistors and the first terminals comprise source electrodes, the second terminals comprise gate electrodes, and the third terminals comprise drain electrodes.

Alternatively more preferably, the first circuit comprises first and second transistors connected in series between a first signal line and a reference potential and third and fourth transistors connected in series between a second signal line and a reference potential; the second circuit comprises fifth and sixth transistors connected in series between the first signal line and the reference potential and seventh and eighth transistors connected in series between the second signal line and the reference potential; one data of the differential data is input to control terminals of the first and seventh transistors and another data of the differential data is input to control terminals of the third and fifth transistors; control terminals of the second and fourth transistors are connected to an output line of the select drive signal of the driving source; and control terminals of the sixth and eighth transistors are connected to the reference potential.

Still more preferably, the first to eighth transistors comprise gate insulation type field effect transistors and the control terminals are gate electrodes.

Alternatively more preferably, the first circuit comprises a first transistor connected between the first signal line and an input line of one data of a first differential data and a second transistor connected between the second signal line and another data of the first differential signal; the second circuit comprises a third transistor connected between the second signal line and an input line of another data of the second differential data and a fourth transistor connected between the first signal line and an input line of one data of the second differential data; and gate electrodes of the first and second transistors are connected to an output line of the driving source and gate electrodes of the third and fourth transistors are connected to the reference potential.

Still more preferably, the first, second, third, and fourth transistors comprise gate insulation type field effect transistors.

According to the present invention, multi-phase data signals are input to first and second circuits in respective signal extracting circuits, for example, in parallel.

The timing is adjusted in order to change a value of the multi-phase data signal when the first circuit in the signal extracting circuit is not selected by a selector and in order not to change the value when being selected.

The signal extracting circuits are selected successively one by one by the selector. As a result, a signal is output to the output circuit from the signal extracting circuit in which the input is ensured, whereby a multiplexed output signal is obtained.

Note that the value of an input potential of the first circuit of the signal extracting circuit is inverted when the value of differential data changes. The inversion of the potential generates a noise signal in an output to the output circuit via, for example, the parasitic capacitances of the transistors constituting the first circuit.

At this time, a signal having an inverted polarity with respect to the first circuit of the signal extracting circuit is generated by the second circuit. As a result, an output signal of the second circuit of the respective signal extracting circuits comes to have the same amplitude as the noise signal from the first circuit and an inverted phase, whereby the noise can be canceled.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.

First Embodiment

Figure 1:
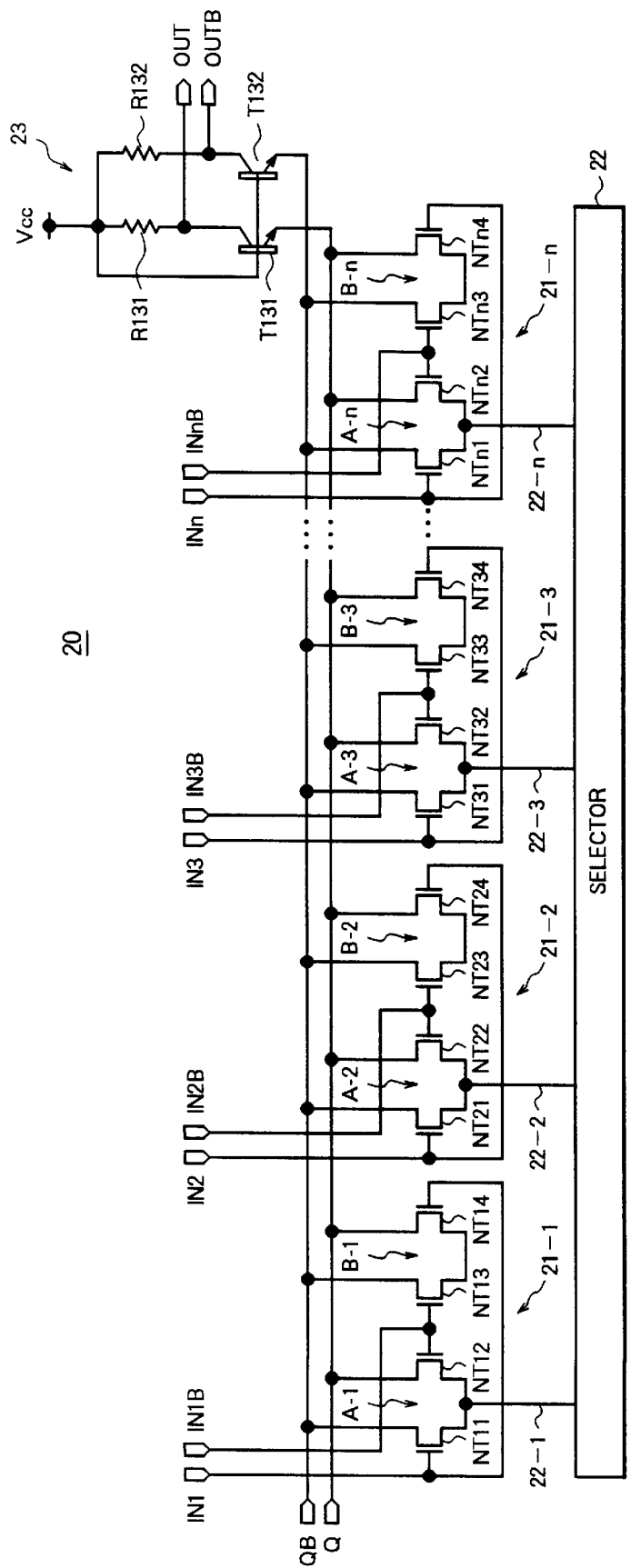
FIG. 1 is a circuit diagram of a first embodiment of a signal multiplexing circuit according to the present invention.

FIG. 1 is a circuit diagram of a first embodiment of a signal multiplexing circuit according to the present invention.

The signal multiplexing circuit 20 comprises signal extracting circuits 21-1, 21-2, 21-3, . . . 21-n constituted by differential amplifiers, a selector 22, an output circuit 23, and a pair of signal lines Q and QB (B indicates inversion) taking the wired-OR of outputs of the signal extracting circuits 21-1 to 21-n to the output circuit 23.

The signal extracting circuit 21-1 comprises NMOS transistors NT11 and NT12, and NT13 and NT14 whose sources are connected to each other.

A connecting point of the sources of the NMOS transistors NT11 and NT12 are connected to the output line 22-1 of a select drive signal of the selector 22.

Gate electrodes of the NMOS transistors NT11 and NT14 are commonly connected to an input line of a differential data signal IN1, and gate electrodes of the NMOS transistors NT12 and NT13 are commonly connected to an input line of a differential data signal IN1B.

Drains of the NMOS transistors NT11 and NT13 are connected to the signal line QB, and drains of the NMOS transistors NT12 and NT14 are connected to the signal line Q.

In this way, the signal extracting circuit 21-1 comprises a signal extracting use differential amplifier A-1 as a first circuit constituted by NMOS transistors NT11 and NT12 and a second differential amplifier B-1 as a second circuit constituted by NMOS transistors NT13 and NT14 having an inverted polarity output with respect to the differential amplifier A-1.

The signal extracting circuit 21-2 comprises NMOS transistors NT21 and NT22 and NMOS transistors NT23 and NT24, whose sources are connected to each other.

The connecting point of the sources of the NMOS transistors NT21 and NT22 is connected to the output line 22-2 of a select drive signal of the selector 22.

Gate electrodes of the NMOS transistors NT21 and NT24 are commonly connected to the input line of the differential data signal IN2, and gate electrodes of the NMOS transistors NT22 and NT23 are commonly connected to the input line of the differential data signal IN2B.

Drains of the NMOS transistors NT21 and NT23 are connected to the signal line QB, and drains of the NMOS transistors NT22 and NT24 are connected to the signal line Q.

In this way, the signal extracting circuit 21-2 comprises a set of a signal extracting use differential amplifier A-2 as a first circuit constituted by NMOS transistors NT21 and NT22 and a second differential amplifier B-2 as a second circuit constituted by NMOS transistors NT23 and NT24 having an inverted polarity output with respect to the differential amplifier A-2.

The signal extracting circuit 21-3 comprises NMOS transistors NT31 and NT32 and NMOS transistors NT33 and NT34, whose sources are connected to each other.

The connecting point of the sources of the NMOS transistors NT31 and NT32 is connected to an output line 22-3 of a select drive signal of the selector 22.

Gate electrodes of the NMOS transistors NT31 and NT34 are commonly connected to an input line of a differential data signal IN3, and gate electrodes of the NMOS transistors NT32 and NT33 are commonly connected to an input line of a differential data signal IN3B.

Drains of the NMOS transistors NT31 and NT33 are connected to the signal line QB, and drains of the NMOS transistors NT32 and NT34 are connected to the signal line Q.

In this way, the signal extracting circuit 21-3 comprises a signal extracting use differential amplifier A-3 as a first circuit constituted by NMOS transistors NT31 and NT32 and a second differential amplifier B-3 as a second circuit constituted by NMOS transistors NT33 and NT34 having an inverted polarity output with respect to the differential amplifier A-3.

In the same way, the signal extracting circuit 21-n comprises NMOS transistors NTn1 and NTn2 and NMOS transistors NTn3 and NTn4, whose sources are connected to each other.

The connecting point of the sources of the NMOS transistors NTn1 and NTn2 is connected to an output line 22-n of a select drive signal of the selector 22.

Gate electrodes of the NMOS transistors NTn1 and NTn4 are commonly connected to an input line of the differential data signal INn, and gate electrodes of the NMOS transistors NTn2 and NTn3 are commonly connected to an input line of the differential data signal INnB.

Drains of the NMOS transistors NTn1 and NTn3 are connected to the signal line QB, and drains of the NMOS transistors NTn2 and NTn4 are connected to the signal line Q.

In this way, the signal extracting circuit 21-n comprises a signal extracting use differential amplifier A-n constituted by NMOS transistors NTn1 and NTn2 and a second differential amplifier B-n constituted by NMOS transistors NTn3 and NTn4 having an inverted polarity output with respect to the differential amplifier A-n.

The selector 22 has n number of output lines (select lines) 22-1 to 22-n of the select drive signal which are respectively connected to the connecting points of the sources of the NMOS transistors constituting the differential amplifiers A-1 to A-n as a first circuit of the signal extracting circuits 21-1 to 21-n. The selector 22 selectively drives (passes a current to) the respective select lines 22-1 to 22-n to make the differential amplifiers A-1 to A-n of the signal extracting circuits 21-1 to 21-n operate.

Note that the differential amplifiers B-1 to B-n of the signal extracting circuit 21-1 to 21-n are always held in a non-selected state.

The output circuit 23 comprises npn-type transistors T131 and T132 and resistors R131 and R132.

An emitter of the transistor T131 is connected to the signal line Q, and an emitter of the transistor T132 is connected to the signal line QB.

Bases of the transistors T131 and T132 are connected to a supply line of a power source voltage Vcc.

Collectors of the transistors T131 and T132 are connected to the supply line of the power source voltage Vcc via the resistors R131 and R132, respectively. A signal OUT is output from a connecting point of the collector of the transistor T131 and the resistor R131, and a signal OUTB is output from a connecting point of the transistor T132 and resistor R132.

Next, the operation of the above configuration will be explained.

When multiplexing n-phase data, multi-phase differential data signals IN1, IN1B . . . INn, INnB are input to gate electrodes of the differential amplifiers A-1 to A-n constituted by the NMOS transistors NT11 and NT12 . . . NTn1 and NTn2 of the respective signal extracting circuits 21-1 to 21-n.

The timing is adjusted so as to change a value of the multi-phase differential data signals IN1, IN1B INn, INnB when differential amplifiers A-1 to A-n of the signal extracting circuits 21-1 to 21-n are not selected by the selector 22 and so as not to change the input potential when selected.

The signal extracting circuits 21-1 to 21-n are selected successively one by one by the selector 22. As a result, signals are output to the signal lines Q and QB from the signal extracting circuit where the input has been ensured.

The signals output to the signal lines Q and QB are input to the output circuit 23, where multiplexed output signals OUT and OUTB are obtained.

Note that the input potential of the differential amplifiers A-1 to A-n of the signal extracting circuits 21-1 to 21-n invert when the value of the differential data signal changes. The inversion of the input potential generates a noise signal in an output to the output circuit 23 via the parasitic capacitances of the NMOS transistors NT11, NT12 . . . NTn1 and NTn2 constituting the differential amplifiers A-1 to A-n.

At this time, signals are also output from the second differential amplifiers B-1 to B-n having exactly the same structure but inverted in polarity as the differential amplifiers A-1 to A-n of the signal extracting circuits 21-1 to 21-n via parasitic capacitances of the NMOS transistors NT13, NT14 . . . NTn3 and NTn4.

The output signal comes to have the same amplitude and an inverted phase with respect to the noise signal from the differential amplifiers A-1 to A-n, whereby the noise can be canceled.

The fact that noise can be actually canceled will be explained with reference to waveforms of an actual circuit simulation.

Figure 2:
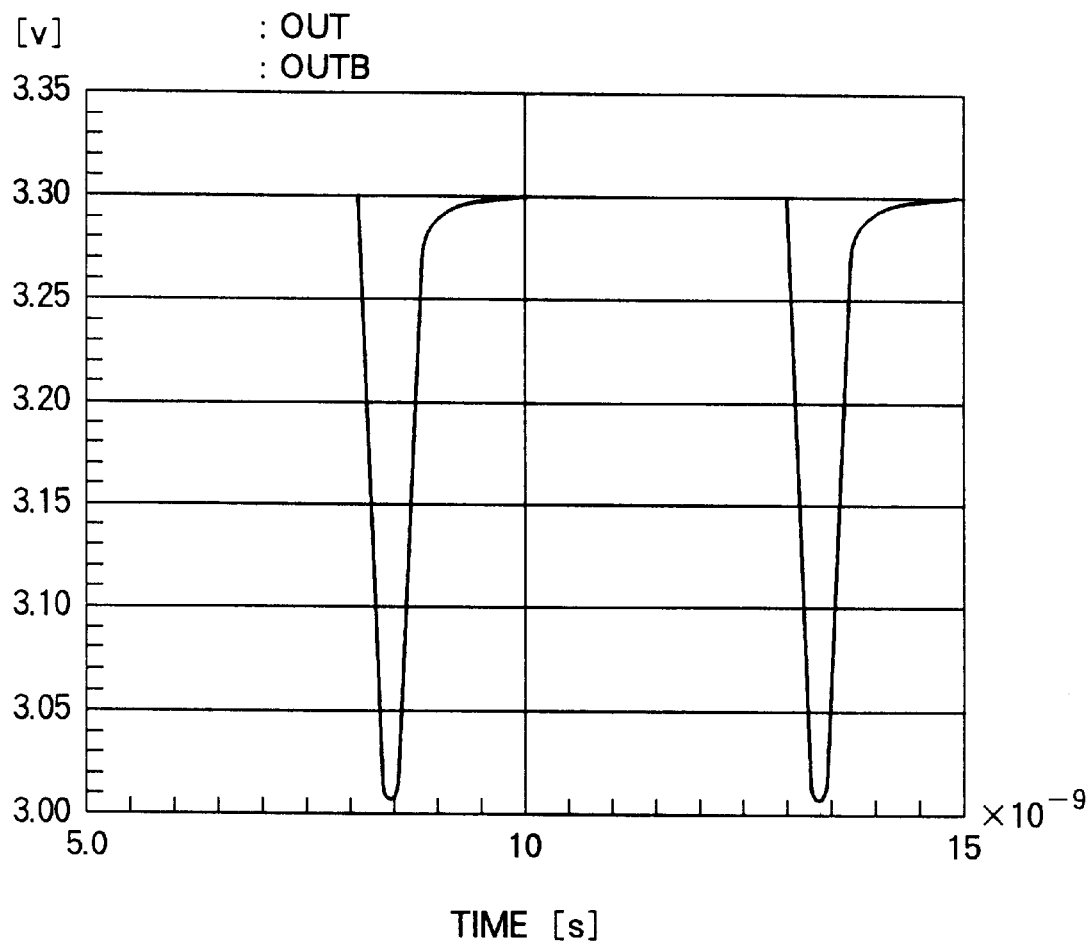
FIG. 2 is a view of waveforms of an output voltage of output signals OUT/OUTB of an output circuit 23 in the circuit of FIG. 1.
Figure 3:
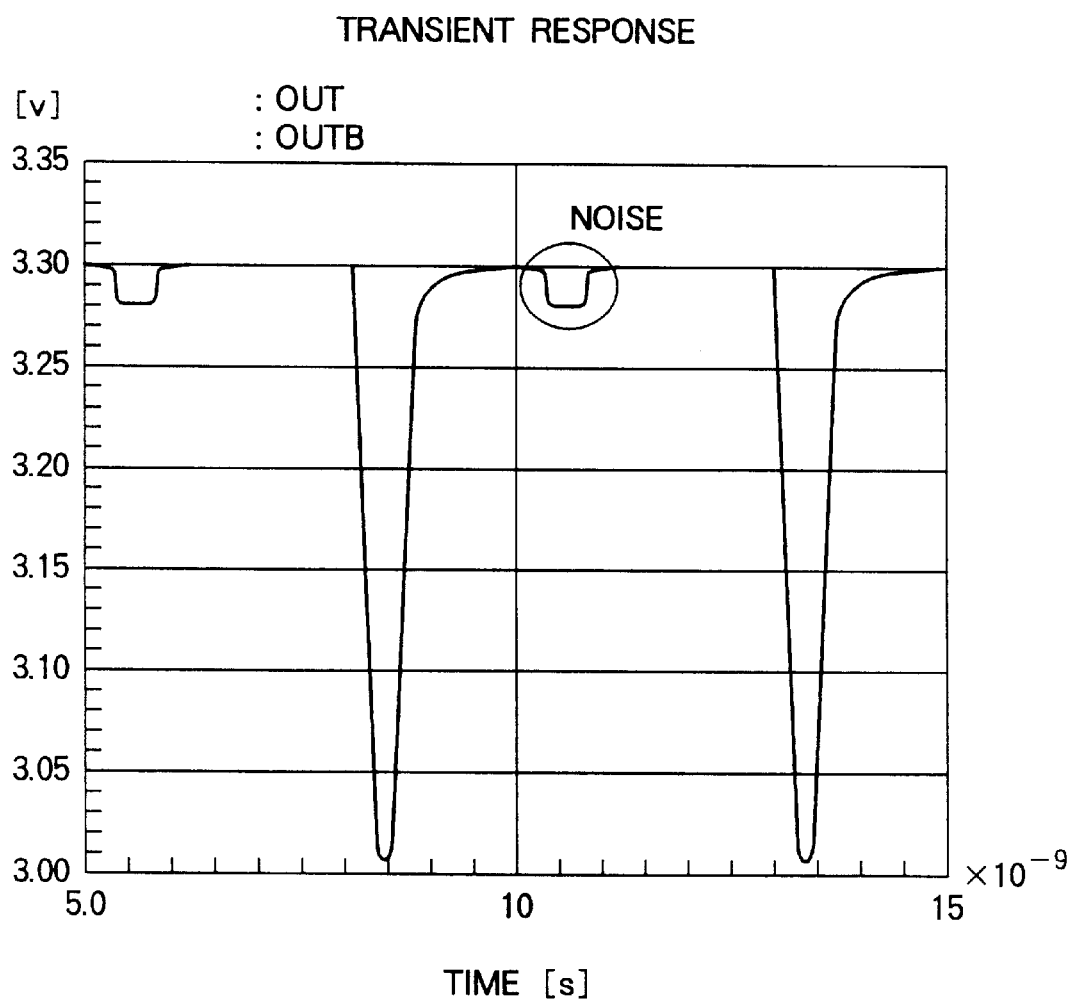
FIG. 3 is a view of waveforms of an output voltage of output signals OUT/OUTB of an output circuit 13 in the circuit of FIG. 6.
Figure 6:
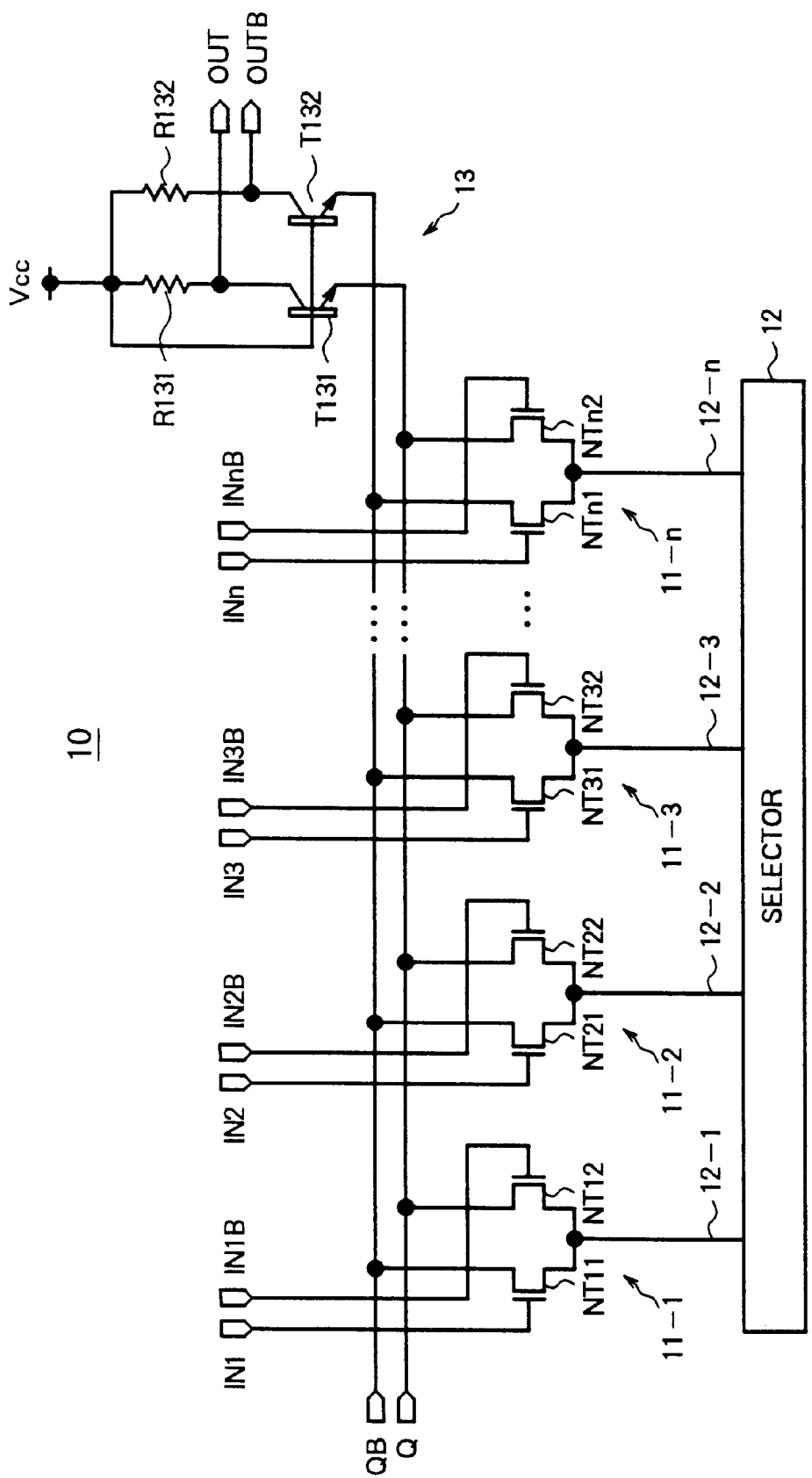
FIG. 6 is a circuit diagram of an example of the configuration of a signal multiplexing circuit of the related art.
Figure 7:
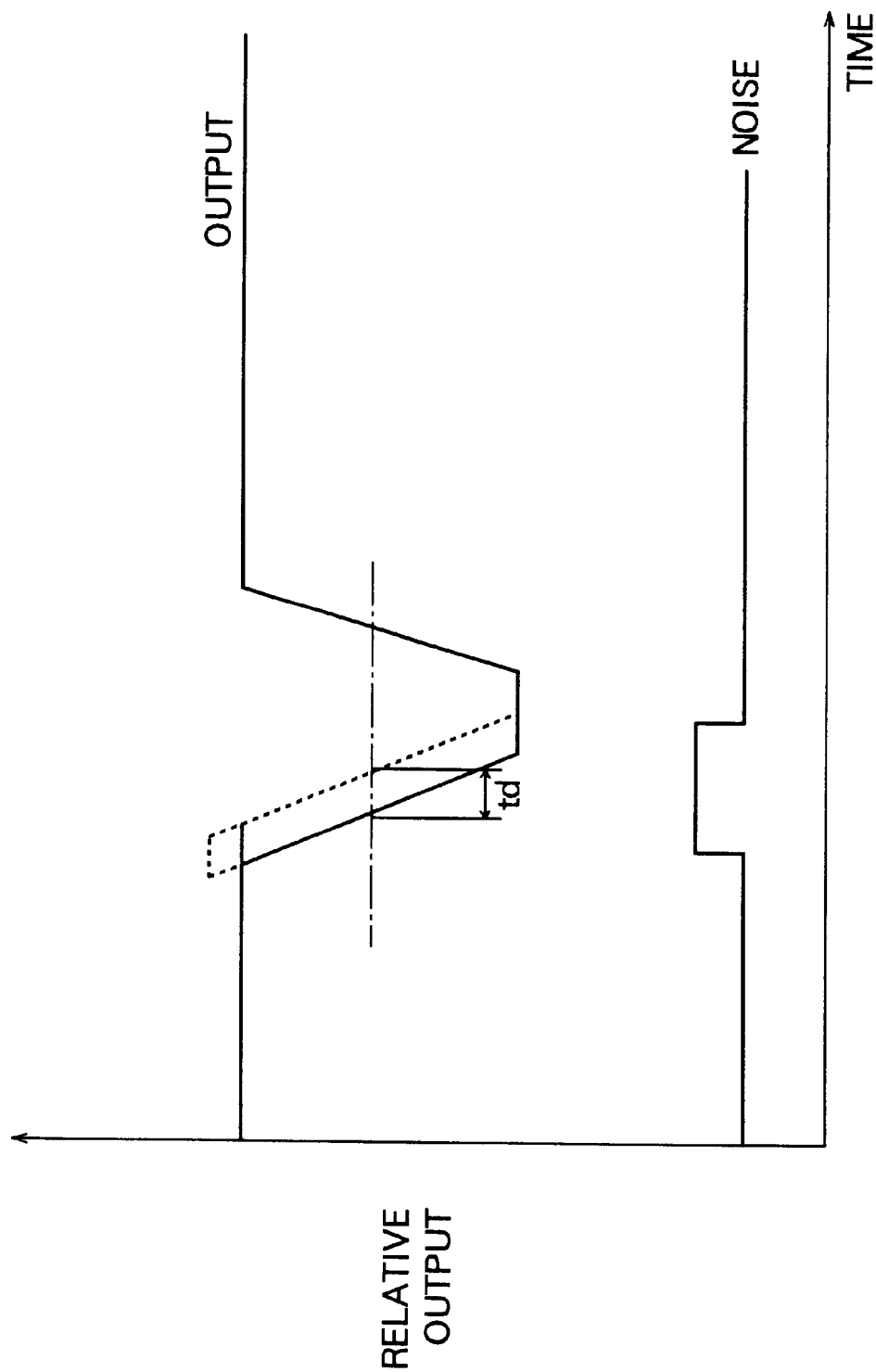
FIG. 7 is a view for explaining the disadvantages of the circuit of FIG. 6.

FIG. 2 is a view of waveforms of an output voltage of the output signals OUT/OUTB of the output circuit 23 of FIG. 1. FIG. 3 is a view of waveforms of an output voltage of the output signals OUT/OUTB of the output circuit 23 in the circuit of FIG. 6.

In FIGS. 2 and 3, an abscissa indicates time and an ordinate indicates a voltage.

As shown in FIG. 3, in the related art, a very large noise output is generated compared with an output signal in spite of being not selected by a selector when an input signal is inverted according to the above reason.

On the other hand, as shown in FIG. 2, in the circuit according to the first embodiment wherein the second differential amplifiers B-1 to B-n are added, noise is canceled and there is almost no noise output.

In this way, in the circuit according to the first embodiment, it is possible to confirm by the circuit simulation that the noise output is suppressed to be very low compared with the related art.

As explained above, according to the first embodiment, a first circuit which receives a select drive signal and outputs input differential data is constituted by NMOS transistors NTn1 and NTn2 whose sources are commonly connected. A second circuit which outputs the input differential data with an inverted phase with respect to the first circuit and adds it to the output of the first circuit and which is never selected by the select drive signal is constituted by NMOS transistors NTn3 and NTn4 whose sources are commonly connected. A signal extracting circuit 21-n is configured to connect a connecting point of the sources of the NMOS transistors NTn1 and NTn2 to an output line of the select drive signal 22-n of the selector 22. Therefore, it is possible to cancel the output noise of the signal multiplexing circuit and reduce jitter of the output signal. Accordingly, there is an advantage that a high speed operation of the signal multiplexing circuit (for example, a parallel serial transmission at 1 GHz or 2 GHz) can be realized.

Note that in the first embodiment, an example where differential amplifiers B-1 to B-n are used as noise cancel circuits was explained, however, the present invention is not limited to this case. Needless to say other embodiments are possible, as follows.

Second Embodiment

Figure 4:
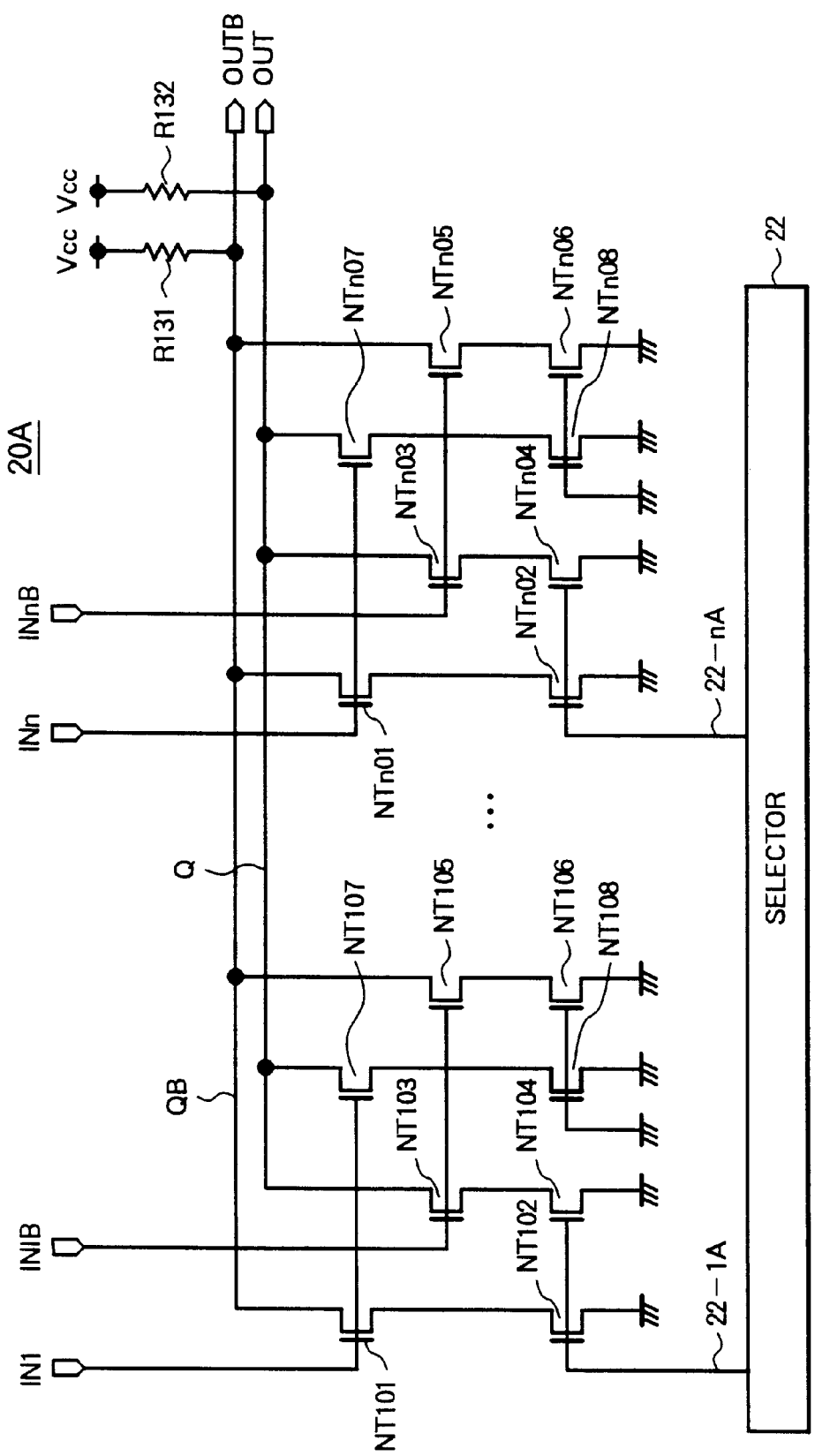
FIG. 4 is a circuit diagram of a second embodiment of a signal multiplexing circuit according to the present invention.

FIG. 4 is a circuit diagram of a second embodiment of a signal multiplexing circuit according to the present invention.

In a signal multiplexing circuit 20A according to the second embodiment, signal extracting circuits 21-1 to 21-n are configured as follows instead of being configured by two differential amplifiers.

Namely, as shown in FIG. 4, in a signal extracting circuit 21-1A, a first circuit is constituted by NMOS transistors NT101 and NT102 connected in series between a signal line QB and a ground line (reference potential) and NMOS transistors NT103 and NT104 connected in series between a signal line Q and the ground line.

Furthermore, a second circuit is constituted by NMOS transistors NT105 and NT106 connected in series between the signal line QB and the ground line and NMOS transistors NT107 and NT108 connected in series between the signal line Q and the ground line.

Differential data IN1 is input to gate electrodes of the NMOS transistors NT101 and NT107, differential data IN1B is input to gate electrodes of the NMOS transistors NT103 and NT105, gate electrodes of the NMOS transistors NT102 and NT104 of the first circuit are connected to an output line of the select drive signal 22-1 of the selector 22, and gate electrodes of the NMOS transistors NT106 and NT108 of the second circuit are connected to the ground line.

In the same way, in a signal extracting circuit 21-nA, a first circuit is constituted by NMOS transistors NTn01 and NTn02 connected in series between the signal line QB and the ground line (reference potential) and NMOS transistors NTn03 and NTn04 connected in series between the signal line Q and the ground line.

Furthermore, a second circuit is constituted by NMOS transistors NTn05 and NTn06 connected in series between the signal line QB and the ground line and NMOS transistors NTn07 and NTn08 connected in series between the signal line Q and the ground line.

Differential data INn is input to gate electrodes of the NMOS transistors NTn01 and NTn07, differential data INnB is input to gate electrodes of the NMOS transistors NTn03 and NTn05, gate electrodes of the NMOS transistors NTn02 and NTn04 of the first circuit are connected to an output line of the select drive signal 22-n of the selector 22, and gate electrodes of the NMOS transistors NTn06 and NTn08 of the second circuit are connected to the ground line.

Although NMOS transistors are not used for a differential amplifier in the above configuration, the embodiment operates in the same way as in the first embodiment explained above and is capable of canceling output noise of the signal multiplexing circuit and reducing jitter of the output signal.

Third Embodiment

Figure 5:
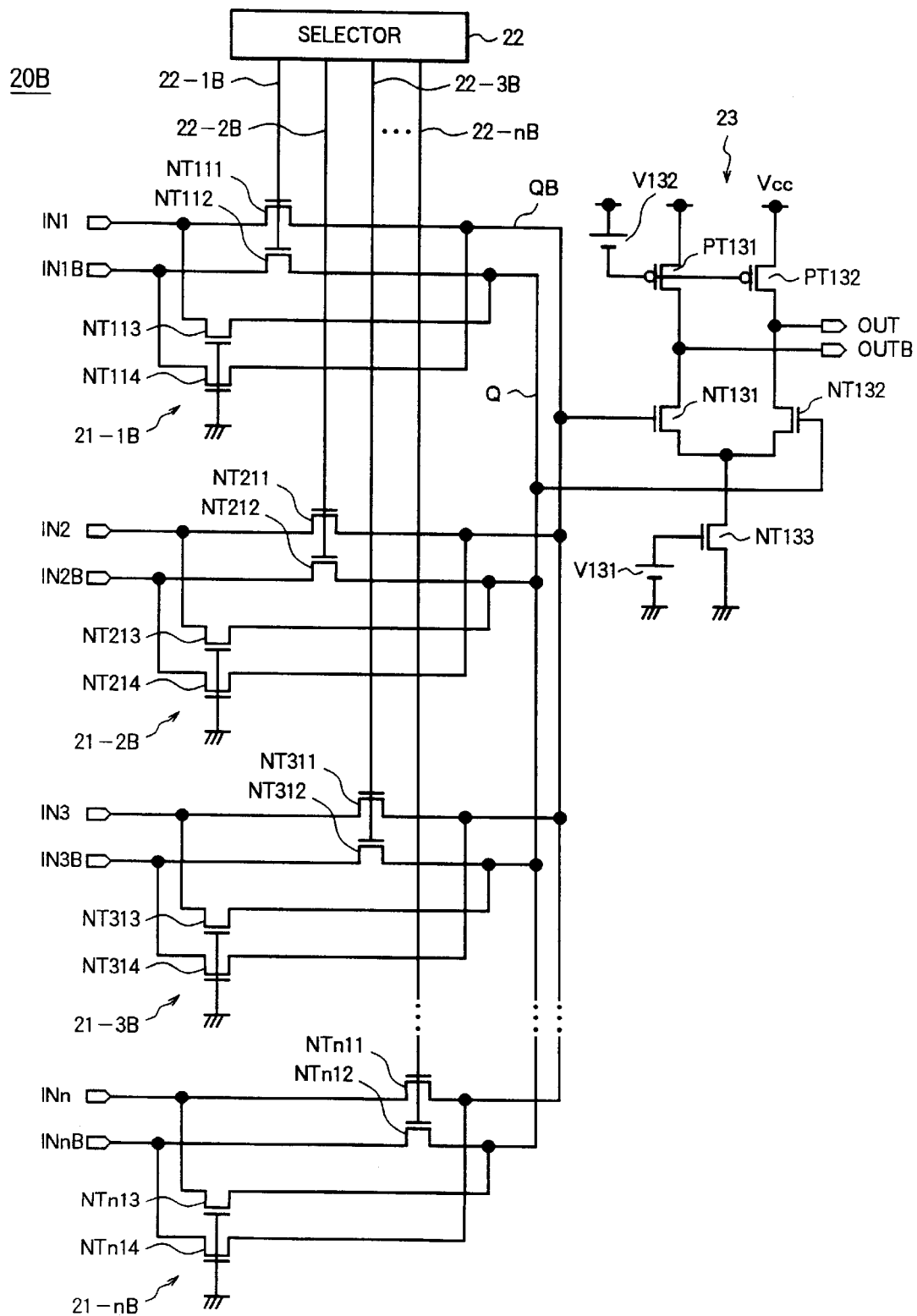
FIG. 5 is a circuit diagram of a third embodiment of a signal multiplexing circuit according to the present invention.

FIG. 5 is a circuit diagram of a third embodiment of a signal multiplexing circuit according to the present invention.

In the signal multiplexing circuit 20B according to the third embodiment, signal extracting circuits 21-1B to 21-nB are configured as follows instead of being configured by two differential amplifiers.

Namely, in a signal extracting circuit 21-1B, a first circuit is constituted by an NMOS transistor NT111 connected between a signal line QB and input line of the differential data IN1 and an NMOS transistors NT112 connected between a signal line Q and an input line of differential data IN1B.

Furthermore, a second circuit is constituted by an NMOS transistor NT113 connected between the signal line Q and the input line of the differential data IN1 and an NMOS transistor NT114 connected between the signal line QB and the input line of the differential data IN1B.

Gate electrodes of the NMOS transistors NT111 and NT112 of the first circuit are connected to an output line of the select drive signal 22-1B of the selector 22, and gate electrodes of the NMOS transistors NT113 and NT114 of the second circuit are connected to the ground line.

In the same way, in a signal extracting circuit 21nB, the first circuit is constituted by an NMOS transistor NTn11 connected between the signal line QB and the input line of the differential data INn and an NMOS transistor NTn12 connected between the signal line Q and the input line of the differential data INnB.

Furthermore, a second circuit is constituted by an NMOS transistor NTn13 connected between the signal line Q and the input line of the differential data INn and an NMOS transistor NTn14 connected between the signal line QB and the input line of the differential data INnB.

Gate electrodes of the NMOS transistors NTn11 and NTn12 of the first circuit are connected to an output line of a select drive signal 22-nB and gate electrodes of the NMOS transistors NTn13 and NTn14 of the second circuit are connected to the ground line.

Note that in the third embodiment, an output circuit 23 is constituted by NMOS transistors NT131 to NT133 constituting an amplifier and p-channel MOS (PMOS) transistors PT131 and PT132 as a load.

Although NMOS transistors are not used for a differential amplifier in the above configuration in the same way as in the second embodiment, the embodiment operates in the same way as in the first embodiment explained above and is capable of canceling output noise of the signal multiplexing circuit and reducing jitter of the output signal.

Summarizing the effects of the invention, as explained above, according to the present invention, it is possible to cancel output noise of a signal multiplexing circuit and reduce jitter of an output signal. As a result, a high speed operation of the signal multiplexing circuit can be realized.

While the invention has been described with reference to specific embodiment chosen for purpose of illustration, it should be apparent that numerous modifications could be made thereto by those skilled in the art without departing from the basic concept and scope of the invention.

What is claimed is:

1. A signal multiplexing circuit which ensures multi-phase differential data changing in different phases to multiplex the data, comprising:
   a plurality of signal extracting circuits, each receiving as input different differential data, including
      a first circuit for outputting the input differential data when receiving a select drive signal and
      a second circuit for outputting the input differential data with an inverted phase with respect to the first circuit so as to add it to the output of the first circuit and never being selected by the select drive signal;
   a driving source for selectively outputting the select drive signal to the first circuit of the signal extracting circuits; and
   an output circuit for multiplexing outputs of the signal extracting circuits and outputting the signal.

2. A signal multiplexing circuit as set forth in claim 1, wherein the output circuit comprises:
   a pair of first and second signal lines connected in a wired-OR manner to outputs of the first and second circuits of the signal extracting circuits and
   an output amplifier for outputting the signals which are output to the first and second signal lines.

3. A signal multiplexing circuit as set forth in claim 2, wherein:
   the first circuit comprises first and second transistors with first terminals which are commonly connected;
   the second circuit comprises third and fourth transistors with first terminals which are commonly connected;
   one data of the differential data is input to second terminals of the first and fourth transistors, another data of the differential data is input to the second terminals of the second and third transistors, third terminals of the first and third transistors are connected to the first signal line, third terminals of the second and fourth transistors are connected to the second signal line, and first terminals of the first and second transistors are connected to an output of the driving source.

4. A signal multiplexing circuit as set forth in claim 3, wherein:
   the first, second, third, and fourth transistors comprise gate insulation type field effect transistors and
   the first terminals comprise source electrodes, the second terminals comprise gate electrodes, and the third terminals comprise drain electrodes.

5. A signal multiplexing circuit as set forth in claim 2, wherein
   the first circuit comprises first and second transistors connected in series between a first signal line and a reference potential and third and fourth transistors connected in series between a second signal line and a reference potential;
   the second circuit comprises fifth and sixth transistors connected in series between the first signal line and the reference potential and seventh and eighth transistors connected in series between the second signal line and the reference potential;
   one data of the differential data is input to control terminals of the first and seventh transistors and another data of the differential data is input to control terminals of the third and fifth transistors;
   control terminals of the second and fourth transistors are connected to an output line of the select drive signal of the driving source; and
   control terminals of the sixth and eighth transistors are connected to the reference potential.

6. A signal multiplexing circuit as set forth in claim 5, wherein:
   the first to eighth transistors comprise gate insulation type field effect transistors and
   the control terminals are gate electrodes.

7. A signal multiplexing circuit as set forth in claim 2, wherein
   the first circuit comprises a first transistor connected between the first signal line and an input line of one data of a first differential data and a second transistor connected between the second signal line and another data of the first differential signal;
   the second circuit comprises a third transistor connected between the second signal line and an input line of another data of the second differential data and a fourth transistor connected between the first signal line and an input line of one data of the second differential data; and gate electrodes of the first and second transistors are connected to an output line of the driving source and gate electrodes of the third and fourth transistors are connected to the reference potential.

8. A signal multiplexing circuit as set forth in claim 7, wherein the first, second, third, and fourth transistors comprise gate insulation type field effect transistors.

9. A signal multiplexing circuit which ensures multi-phase differential data changing in different phases to multiplex the data, comprising:
- a plurality of signal extracting circuits, each receiving as input different differential data, including
  - a first circuit for outputting the input differential data when receiving a select drive signal and
  - a second circuit for outputting the input differential data with an inverted phase with respect to the first circuit so as to add it to the output of the first circuit and never being selected by the select drive signal;
- a selector for selectively outputting the select drive signal to the first circuit of the signal extracting circuits; and
- an output circuit for multiplexing outputs of the signal extracting circuits and outputting the signal.

10. A signal multiplexing circuit as set forth in claim 9, wherein the output circuit comprises
- a pair of first and second signal lines connected in a wired-OR manner to outputs of the first and second circuits of the signal extracting circuits and
- an output amplifier for outputting signals output to the first and second signal lines.

11. A signal multiplexing circuit as set forth in claim 10, wherein:
- the first circuit comprises first and second transistors with input terminals which are commonly connected to each other;
- the second circuit comprises third and fourth transistors with input terminals which are commonly connected to each other; and
- one data of the differential data is input to control terminals of the first and fourth transistors, another data of the differential data is input to control terminals of the second and third transistors, output terminals of the first and third transistors are connected to the first signal line, output terminals of the second and fourth transistors are connected to the second signal line, and input terminals of the first and second transistors are connected to an output of the selector.

12. A signal multiplexing circuit as set forth in claim 11, wherein the first, second, third, and fourth transistors comprise gate insulation type field effect transistors and the input terminals comprise source electrodes, the control terminals comprise gate electrodes, and the output terminals comprise drain electrodes.

13. A signal multiplexing circuit as set forth in claim 11, wherein
- the first circuit comprises first and second transistors connected in series between a first signal line and a reference potential and third and fourth transistors connected in series between a second signal line and a reference potential;
- the second circuit comprises fifth and sixth transistors connected in series between the first signal line and the reference potential and seventh and eighth transistors connected in series between the second signal line and the reference potential;
- one data of the differential data is input to control terminals of the first and seventh transistors and another data of the differential data is input to control terminals of the third and fifth transistors;
- control terminals of the second and fourth transistors are connected to an output line of the select drive signal of the selector; and
- control terminals of the sixth and eighth transistors are connected to the reference potential.

14. A signal multiplexing circuit as set forth in claim 13, wherein:
- the first to eighth transistors comprise gate insulation type field effect transistors and
- the control terminals comprise gate electrodes.

15. A signal multiplexing circuit as set forth in claim 10, wherein
- the first circuit comprises a first transistor connected between the first signal line and an input line of one data of the first differential data and a second transistor connected between the second signal line and another data of the first differential signal;
- the second circuit comprises a third transistor connected between the second signal line and an input line of another data of the second differential data and a fourth transistor connected between the first signal line and an input line of one data of the second differential data; and
- gate electrodes of the first and second transistors are connected to an output line of the selector and gate electrodes of the third and fourth transistors are connected to the reference potential.

16. A signal multiplexing circuit as set forth in claim 15, wherein the first, second, third, and fourth transistors comprise gate insulation type field effect transistors.

* * * * *